(12) United States Patent
Tundag et al.

(10) Patent No.: US 8,727,693 B2
(45) Date of Patent: May 20, 2014

(54) APPARATUS FOR OBJECT PROCESSING

(75) Inventors: Francis Medel P. Tundag, Singapore (SG); Han Yong Lam, Singapore (SG); Kam Yee Fong, Singapore (SG)

(73) Assignee: Manufacturing Integration Technology Ltd, Singapore (SG)

( * ) Notice: Subject to any disclaimer, the term of this patent is extended or adjusted under 35 U.S.C. 154(b) by 1227 days.

(21) Appl. No.: 12/596,145

(22) PCT Filed: May 6, 2008

(86) PCT No.: PCT/SG2008/000166
§ 371 (c)(1),
(2), (4) Date: Jan. 4, 2011

(87) PCT Pub. No.: WO2008/136778
PCT Pub. Date: Nov. 13, 2008

(65) Prior Publication Data
US 2011/0081223 A1    Apr. 7, 2011

(30) Foreign Application Priority Data

May 7, 2007 (SG) ................................ 200703316-0

(51) Int. Cl.
*B29C 31/00* (2006.01)

(52) U.S. Cl.
USPC ........... 414/759; 414/771; 414/751.1; 29/740

(58) Field of Classification Search
USPC ............ 198/345.1; 29/742; 356/237.4, 237.5; 414/222.01, 222.09, 222.13, 226.01, 414/567, 752.1, 761, 763
See application file for complete search history.

(56) References Cited

U.S. PATENT DOCUMENTS

| | | | |
|---|---|---|---|
| 5,397,423 A * | 3/1995 | Bantz et al. ................... | 156/362 |
| 5,584,647 A | 12/1996 | Ueharra et al. | |
| 5,596,270 A * | 1/1997 | Mitsui ...................... | 324/757.04 |
| 5,765,277 A * | 6/1998 | Jin et al. .......................... | 29/743 |
| 6,658,313 B1 * | 12/2003 | Lee ................................ | 700/117 |
| 6,658,324 B2 * | 12/2003 | Bancroft et al. .............. | 700/245 |
| 6,931,717 B2 * | 8/2005 | Mizuno et al. .................. | 29/740 |
| 2003/0161711 A1 * | 8/2003 | Kwan ........................... | 414/759 |
| 2004/0244915 A1 * | 12/2004 | Lam et al. ..................... | 156/510 |

(Continued)

FOREIGN PATENT DOCUMENTS

| | | |
|---|---|---|
| CN | 1272960 A | 11/2000 |
| CN | 1625930 A | 6/2005 |

(Continued)

OTHER PUBLICATIONS

Substantive Examination Adverse Report for Malaysian patent application No. PI 20094458 mailed Jun. 14, 2013 (3 pages).

(Continued)

*Primary Examiner* — Gregory Adams
(74) *Attorney, Agent, or Firm* — Pyprus Pte Ltd

(57) ABSTRACT

The present invention provides apparatuses for processing an object just as semiconductor chips and dies. The first embodiment comprises two or more pick and place heads (FIG. 1) which operate sequentially (ie leap frog) to pick components from a first location to a second. The second embodiment (FIG. 8) comprises a flipping head combined with a pick and place heads where an object is picked up by the flipping head, turned over and then presented to a pick and place head for relocation to an output.

32 Claims, 14 Drawing Sheets

(56) References Cited

U.S. PATENT DOCUMENTS

| | | | |
|---|---|---|---|
| 2005/0268457 A1* | 12/2005 | Ebihara et al. ................. | 29/740 |
| 2005/0283972 A1* | 12/2005 | Ueno et al. .................... | 29/740 |
| 2007/0059144 A1 | 3/2007 | Lowrance et al. | |
| 2007/0114659 A1 | 5/2007 | Cote et al. | |

FOREIGN PATENT DOCUMENTS

| | | |
|---|---|---|
| DE | WO 03/065783 A1 | 8/2003 |
| DE | WO 2005/078768 A1 | 8/2005 |
| WO | WO 99/56920 A1 | 11/1999 |
| WO | WO 00/02803 A1 | 1/2000 |
| WO | WO 00/02808 A1 | 1/2000 |

OTHER PUBLICATIONS

Office Action for Chinese patent application No. 200880015173.3 mailed Feb. 22, 2011 (16 pages).

* cited by examiner

APPARATUS FOR OBJECT PROCESSING

FIELD OF THE INVENTION

The present invention generally relates to semiconductor technology, and more particularly to apparatuses for object processing, especially for flipping and/or picking and placing a chip.

BACKGROUND OF THE INVENTION

Small objects such as integrated circuit (IC) and IC chips are manufactured in a multi-step process involving different locations; thus they need to be handled properly during the process. For example, for a flip-chip, a chip needs to be flipped for bonding. In addition, chips from a singulated wafer need to be picked and placed into a desired destination. For all of the process operations, precise and efficiency are the main parameters for designing an apparatus for handling the chips.

SUMMARY OF THE INVENTION

One embodiment of the present invention provides an apparatus for object processing. The processing apparatus comprises an input unit for loading a plurality of objects, wherein at least one of plurality of objects is positioned in a first predetermined location; a first Pick & Place (PNP) unit and a second Pick & Place (PNP) unit for picking the positioned object from the first predetermined location and placing the picked object onto a second predetermined location; wherein the first PNP unit and second PNP unit are so configured that they can pick the positioned objects from the first predetermined location sequentially and in turn transport the picked objects to the second predetermined location; a transporting system for transporting the first PNP unit and second PNP unit from the first predetermined location to the second predetermined location and back forth; and an output unit providing the second predetermined location so that the picked objects can be sequentially placed onto the output unit; whereby the output unit unloads the placed objects.

In another embodiment of the apparatus, the plurality of objects are semiconductor dies. In a further embodiment of the apparatus, the semiconductor dies loaded by the input unit and unloaded by the output unit are in a singulated wafer form or a strip form or a magazine form.

In another embodiment of the apparatus, the transporting system comprises a first gantry being disposed with the firs PNP unit and a second gantry being disposed with the second PNP unit, wherein the first gantry and second gantry are positioned on the same horizontal plane and have a mirror configuration so that the first PNP unit and second PNP unit travel along the first gantry and second gantry separately, and stop at the first predetermined location and second predetermined location sequentially; whereby the plurality of objects can be picked at the first predetermined location by the first PNP unit and second PNP unit, transported along the first gantry and second gantry, and placed at the second predetermined location by the first PNP unit and second PNP unit sequentially. In a further embodiment of the apparatus, each of the first PNP unit and second PNP unit comprises a PNP head for picking, transporting and placing one of the plurality of objects, and a maneuverable arm having a first end coupled to the respective gantry, a second end coupled to the PNP head, and a body between the first end and second end, wherein the maneuverable arm is operable according to a user's instructions. In yet another embodiment of the appa-ratus, each of the first PNP unit and second PNP unit further comprises a linear motor for driving the extension or retraction of the maneuverable ann.

In another embodiment of the apparatus, each of the first gantry and second gantry comprises a rail on which the PNP units are operably disposed, and a driving module for moving the operably disposed PNP along the rails.

In another embodiment of the apparatus, the transporting system comprises a first gantry being disposed with the firs PNP unit and a second gantry being disposed with the second PNP unit, wherein the first gantry and second gantry are positioned on two horizontal planes and have a tier configuration so that the first PNP unit and second PNP unit travel along the first gantry and second gantry separately, and stop at the first predetermined location and second predetermined location sequentially; whereby the plurality of objects can be picked at the first predetermined location by the first PNP unit and second PNP unit, transported along the first gantry and second gantry, and placed at the second predetermined location by the first PNP unit and second PNP unit sequentially.

In a further embodiment of the apparatus, each of the first PNP unit and second PNP unit comprises a PNP head for picking, transporting placing one of the plurality of objects, and a maneuverable arm having a first end coupled to the respective gantry, a second end coupled to the PNP head, and a body between the first end and second end, wherein the maneuverable arm is operable according to a user's instructions. In another further embodiment of the apparatus, each of the first PNP unit and second PNP unit further comprises a linear motor for driving the extension or retraction of the maneuverable arm. In yet further embodiment of the apparatus, each of the first gantry and second gantry comprises a rail on which the PNP units are operably disposed, and a driving module for moving the operably disposed PNP along the rails.

In another embodiment of the apparatus, each of the first PNP unit and second unit further comprises a Z-axis linear motor for driving the PNP unit to move along Z-axis.

In another embodiment of the apparatus, it further comprises a vision inspection system for capturing and/or processing the image of the object during object processing, and a control system for receiving information from the vision inspection system and sending instructions to other components of the apparatus for precise picking and placing the object. In a further embodiment of the apparatus, the vision inspection system comprises an input inspection camera for capturing the image of the object on the input unit in the first predetermined location and optionally processing the captured image; at least one bottom inspection camera for capturing the image of the object picked by each of the first PNP unit and second PNP unit, wherein the at least one bottom inspection camera is disposed between the first predetermined location and second predetermined location, and optionally processing the captured image; and an output inspection camera for capturing the image of the object placed by the PNP units on the output unit in the second predetermined location. In another further embodiment of the apparatus, each inspection camera of the vision inspection system comprises an image unit for capturing images of the object, and an optional vision microprocessor for processing the captured image.

Another embodiment of the present invention provides an apparatus for object processing. The processing apparatus comprises an input unit for loading a plurality of objects, wherein at least one of plurality of objects is positioned in a first predetermined location; a flipping mechanism for picking up the positioned object at the first predetermined location, flipping the picked object, and positioning the flipped object in a second predetermined location, whereby the opposite side of the flipped object is available for further processing; a Pick & Place (PNP) mechanism for picking up the flipped object at the second predetermined location, transporting the picked flipped object to a third predetermined location, and placing the picked flipped object at the third predetermined location; a transporting system for transporting the PNP mechanism from the second predetermined location to the third predetermined location and back forth; and an output unit providing the third predetermined location so that the picked flipped object can be placed onto the output unit.

In another embodiment of the apparatus, the plurality of objects are semiconductor dies. In a further embodiment of the apparatus, the semiconductor dies loaded by the input unit and unloaded by the output unit are in a singulated wafer form or a strip form or a magazine form.

In another embodiment of the apparatus, the flipping mechanism comprises one flipper and a driving means for driving the flipper, and wherein the flipper comprises a flipper arm having two free ends and operable to rotate about a pivot, two flipper heads attached to the two ends of the flipper arm for sequentially acquiring the object from the input unit at the first predetermined location and positioning the flipped object in the second predetermined location.

In another embodiment of the apparatus, the flipping mechanism comprises a first flipping unit and a second flipping unit; wherein each of the first flipping unit and second flipping unit comprises a flipper and a driving means for driving the flipper; wherein the flipper comprises at least one flipper head that is able to pick up the positioned object at the first predetermined location and flipping the object to the second predetermined location. In a further embodiment of the apparatus, the first flipping unit and second flipping unit have a configuration that the two units are independently controlled so that they can pick up the positioned object at the first predetermined location. In another further embodiment of the apparatus, the first flipping unit and second flipping unit have a mirror configuration so that each unit picks up the positioned object at the first predetermined location and flipping the picked object to the second predetermined location. In yet another further embodiment of the apparatus, the second predetermined location for the flipped object from the first flipping unit and second flipping unit is different so that the PNP mechanism has to be able to pick the flipped object at two second predetermined locations.

In another embodiment of the apparatus, the PNP mechanism comprises a first Pick & Place (PNP) unit and a second Pick & Place (PNP) unit for picking the positioned flipped object from the second predetermined location; wherein the first PNP unit and second PNP unit are so configured that they can pick the positioned flipped objects sequentially and in turn transport the picked objects to the third predetermined location.

In another embodiment of the apparatus, the transporting system comprises a first gantry being disposed with the firs PNP unit and a second gantry being disposed with the second PNP unit, wherein the first gantry and second gantry are positioned on the same horizontal plane and have a mirror configuration so that the first PNP unit and second PNP unit travel along the first gantry and second gantry separately, and stop at the second predetermined location and third predetermined location sequentially; whereby the plurality of objects can be picked at the second predetermined location by the first PNP unit and second PNP unit, transported along the first gantry and second gantry, and placed at the third predetermined location by the first PNP unit and second PNP unit sequentially.

In another embodiment of the apparatus, each of the first PNP unit and second PNP unit comprises a PNP head for picking, transporting placing one of the plurality of objects, and a maneuverable arm having a first end coupled to the respective gantry, a second end coupled to the PNP head, and a body between the first end and second end, wherein the maneuverable arm is operable according to a user's instructions. In a further embodiment of the apparatus, each of the first PNP unit and second PNP unit further comprises a linear motor for driving the extension or retraction of the maneuverable arm.

In another embodiment of the apparatus, each of the first gantry and second gantry comprises a rail on which the PNP units are operably disposed, and a driving module for moving the operably disposed PNP along the rail.

In another embodiment of the apparatus, the transporting system comprises a first gantry being disposed with the firs PNP unit and a second gantry being disposed with the second PNP unit, wherein the first gantry and second gantry are positioned on two horizontal planes and have a tier configuration so that the first PNP unit and second PNP unit travel along the first gantry and second gantry separately, and stop at the second predetermined location and third predetermined location sequentially; whereby the plurality of objects can be picked at the second predetermined location by the first PNP unit and second PNP unit, transported along the first gantry and second gantry, and placed at the third predetermined location by the first PNP unit and second PNP unit sequentially.

In another embodiment of the apparatus, each of the first PNP unit and second PNP unit comprises a PNP head for picking, transporting placing one of the plurality of objects, and a maneuverable arm having a first end coupled to the respective gantry, a second end coupled to the PNP head, and a body between the first end and second end, wherein the maneuverable arm is operable according to a user's instructions.

In another embodiment of the apparatus, each of the fust PNP unit and second PNP unit further comprises a linear motor for driving the extension or retraction of the maneuverable arm.

In another embodiment of the apparatus, each of the first gantry and second gantry comprises a rail on which the PNP units are operably disposed, and a driving module for moving the operably disposed PNP along the rail.

In another embodiment of the apparatus, each of the first PNP unit and second unit further comprises a Z-axis linear motor for driving the PNP unit to move along Z-axis.

In another embodiment of the apparatus, it further comprises a vision inspection system for capturing and/or processing the image of the object during object processing, and a control system for receiving information from the vision inspection system and sending instructions to other components of the apparatus for precise picking and placing the object.

The objectives and advantages of the invention will become apparent from the following detailed description of preferred embodiments thereof in connection with the accompanying drawings.

BRIEF DESCRIPTION OF THE DRAWINGS

Preferred embodiments according to the present invention will now be described with reference to the Figures accompanied herein, in which like reference numerals denote like elements.

DETAILED DESCRIPTION OF THE INVENTION

The present invention may be understood more readily by reference to the following detailed description of certain embodiments of the invention.

Throughout this application, where publications are referenced, the disclosures of these publications are hereby incorporated by reference, in their entireties, into this application in order to more fully describe the state of art to which this invention pertains.

The present invention provides apparatuses that are capable of processing chips in a precision and high throughput fashion, where the processes include flipping and picking and placing. While the following description of the apparatuses will use specific drawings for illustrating the principles of the present invention, it is apparent that the principles of the present invention are not limited by these specifics. For example, the chips to be picked and placed can be in the format of a strip, a wafer, or a magazine In addition, the combination of features such as flipping and picking and placing solely depends upon a user's need; there is no technical limitation to any desired combinations.

Figure 1:
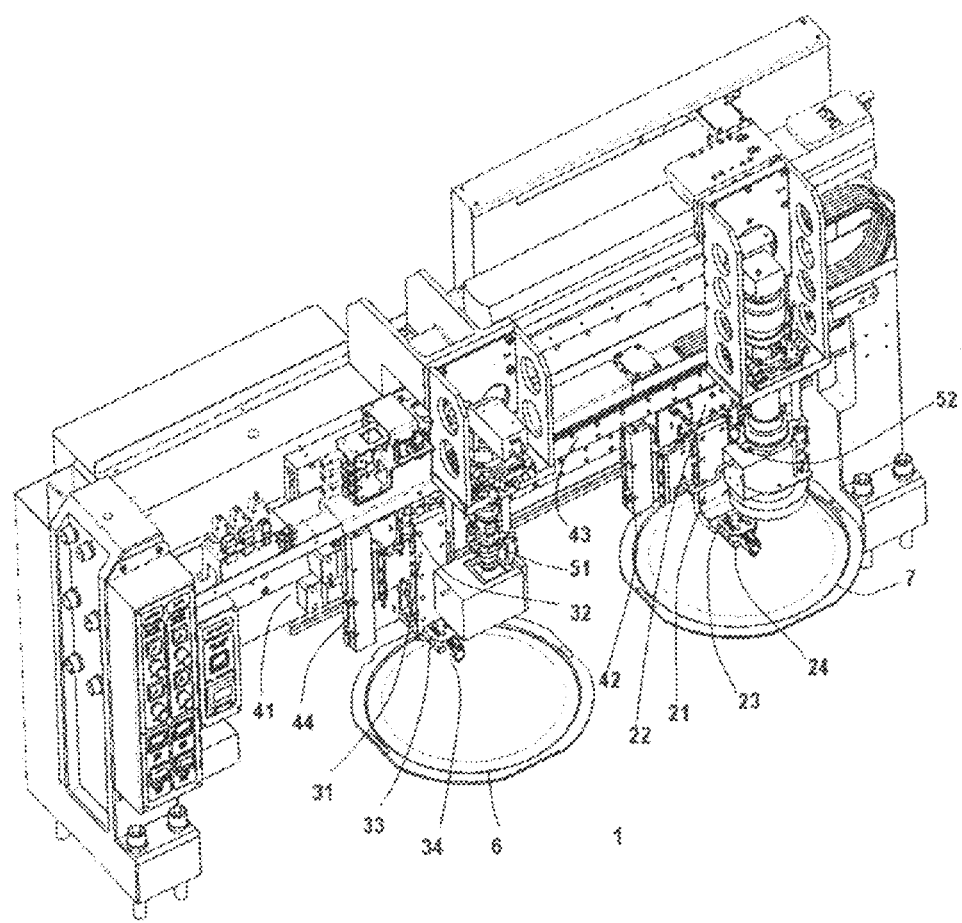
FIG. 1 shows a partial isometric view of an apparatus for picking and placing a chip in accordance with one embodiment of the present invention.

Now referring to FIG. 1, there is provided a partial isometric view of an apparatus for picking and placing a chip in accordance with one embodiment of the present invention. The apparatus 1 comprises a first Pick & Place (PNP) unit 2, a second PNP unit 3, a transport system 4, and a vision inspection system 5. It is to be noted that an input means for loading the chip, an output means for unloading the chip, and a controlling means for operating the apparatus are not shown in FIG. 1; any suitable mechanisms known in the art can be incorporated herein as long as it does not interfere with the principles of the apparatus. In addition, for the convenience of description, the location where the chip is picked up is called the picking location 6, and the location where the chip is placed is called the placing location 7.

Still referring to FIG. 1, the two PNP units 2, 3 pick chips in one location and place them in another location. The first PNP unit 2 comprises a maneuverable arm 21 having two ends, one end 22 is attached to the transport system 4 so that the first PNP unit can be transported from the picking location 6 to the placing location 7 as described in detail hereinafter, and the other end 23 is attached with a pick head 24. The pick head 24 is able to pick up a chip from the picking location and place the chip in the placing location. The pick head 24 can be any known means in the art such as a vacuum sucker that picks up the chip with air pressure and place the chip by releasing the pressure.

Still referring to FIG. 1, the second PNP unit 3 comprises a maneuverable arm 31 having two ends, one end 32 is attached to the transport system 4 so that the first PNP unit can be transported from the picking location to the placing location as described in detail hereinafter, and the other end 33 is attached with a pick head 34. The pick head 34 is able to pick up a chip from the picking location and place the chip in the placing location. The pick head 34 can be any known means in the art such as a vacuum sucker that picks up the chip with air pressure and place the chip by releasing the pressure.

Still referring to FIG. 1, the transport system 4 provides means for transporting the two PNP units from the picking location to the placing location and vice versa. As shown in FIG. 1, the transport system 4 comprises a first gantry 41 and a first driving means 42 for transporting the first PNP unit 2, where the first gantry 41 has a leveled beam allowing the first PNP unit 2 move horizontally, and the first driving means 42 connects the one end 22 of the maneuverable arm and the leveled beam of the first gantry 41. The first driving means 42 can also operate in Z-direction so that it can lift or lower the first PNP unit 2. The first driving means 42 can be a motor in itself or controlled by a motor disposed remotely from the driving means. The transport means 4 further comprises a second gantry 43 and a second driving means 44 for transporting the second PNP unit 3, where the second gantry 43 has a leveled beam allowing the second PNP unit 3 move horizontally, and the second driving means 44 connects the one end 32 of the maneuverable arm and the leveled beam of the second gantry 43. The second driving means 44 can also operate in Z-direction so that it can lift or lower the second PNP unit 3. The second driving means 42 can be a motor in itself or controlled by a motor disposed remotely from the driving means.

Still referring to FIG. 1, the first gantry 41 and second gantry 43 have a tier configuration; as shown, the first gantry 41 is lower than the second gantry 43. As discussed in detail hereinafter, each PNP unit will be lifted into a safe position after they have picked up the chip so as to avoid collision. In this configuration, the two PNP units can be operated in sequence. For example, while the first PNP unit 2 is picking up the chip in the picking location, the second PNP unit 3 is placing the chip in the placing location.

Still referring to FIG. 1, the inspection system 5 comprises an input inspection camera 51 for inspecting the chip picked up by the PNP units, and an output inspection camera 52 for inspecting the chip placed by the PNP units. The inspection system 5 is electronically connected to the controller, where the controller is a microprocessor.

Figure 2:
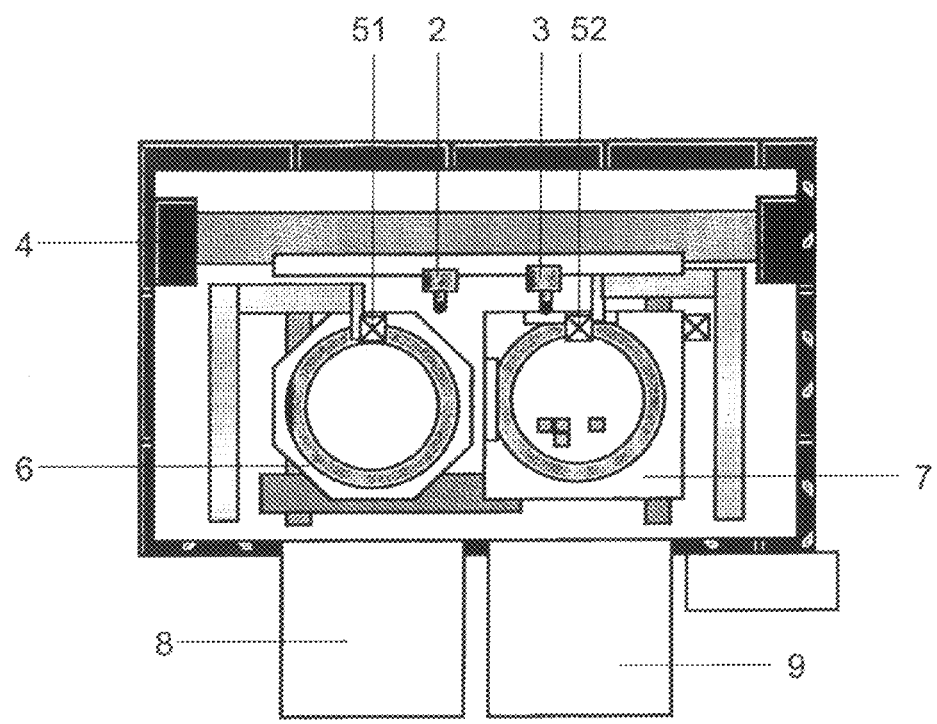
FIG. 2 is a top plan view of the apparatus as shown in FIG. 1.

Now referring to FIG. 2, there is provided a top plan view of the apparatus as shown in FIG. 1. Other than the components described above, the apparatus 1 further comprises an input elevator 8 for loading the chips onto the picking location 6, and an output elevator 9 for unloading the chips from the placing location 7. The input elevator 8 and output elevator 9 are just the representatives for illustrating the input and output means for loading and unloading the chips during the process.

Figure 3:
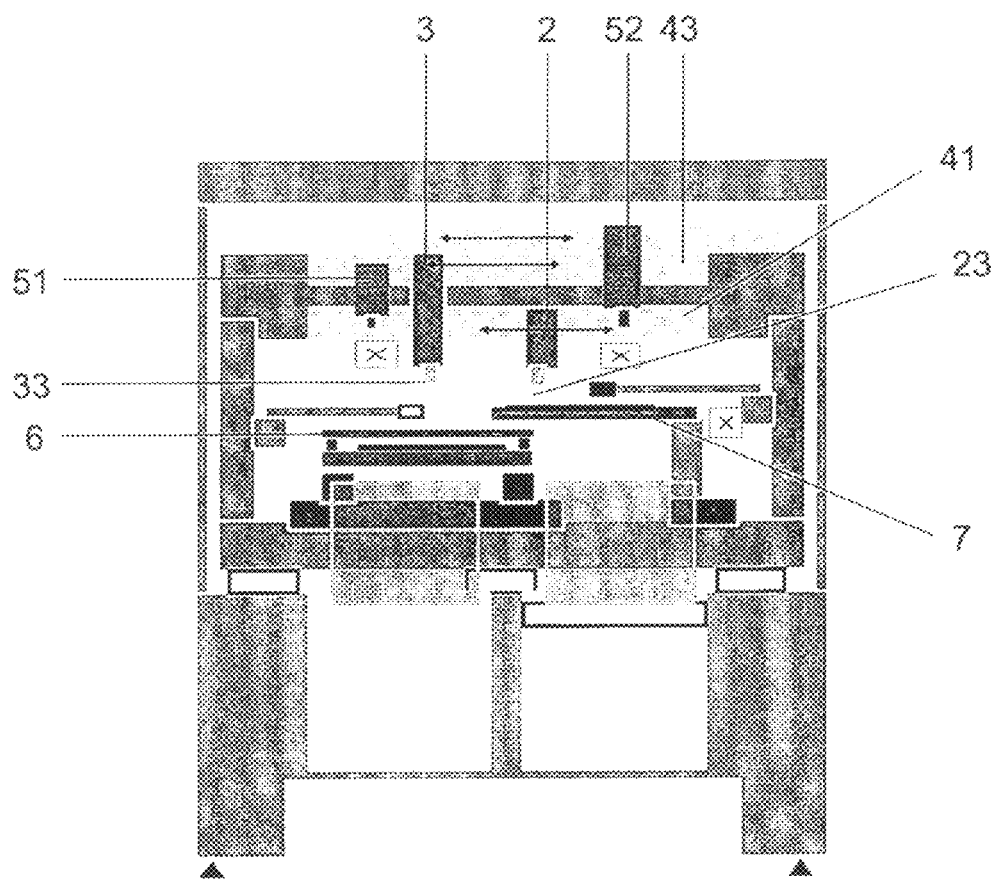
FIG. 3 shows a front plan view of the apparatus shown in FIG. 1 except for the positions for the two PNP units.

Now referring to FIG. 3, there is provided a front plan view of the apparatus shown in FIG. 1 except for the positions for the two PNP units. FIG. 3 shows a tier configuration of the two PNP units, where the first PNP unit 2 shown at the right side is in the lower gantry 41, and the second PNP unit 3 shown at the left side is the upper gantry 43.

Figure 4:
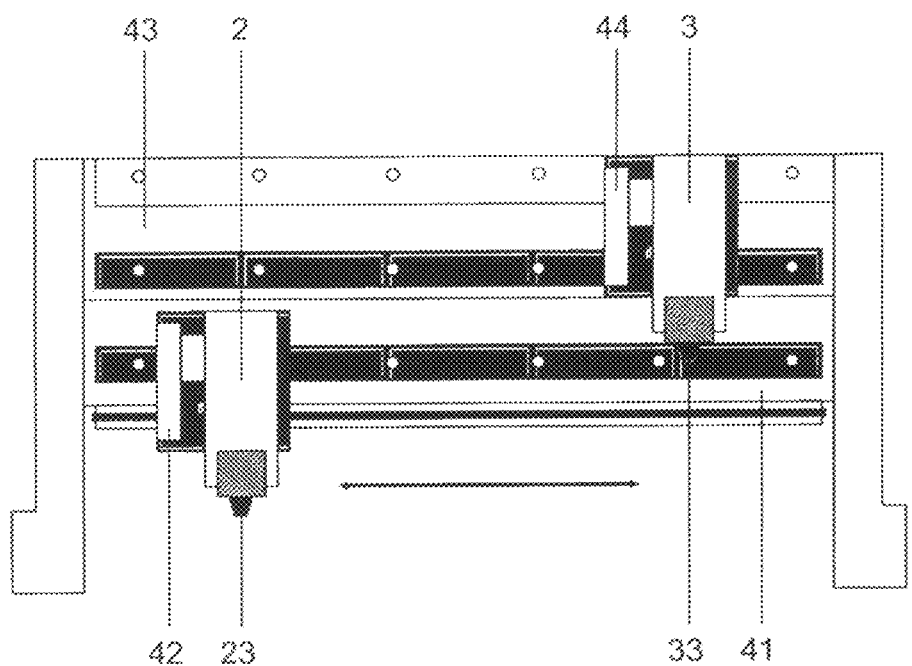
FIG. 4 shows an exploded front view illustrating the tier configuration of the two PNP units shown in FIG. 1.

Now referring to FIG. 4, there is provided an exploded front view illustrating the tier configuration of the two PNP units shown in FIG. 1. All the components have been described above. For the driving means 42, 44, they comprise a Z-axis linear motor so that the PNP units can be lifted and lowered accordingly.

Figure 5:
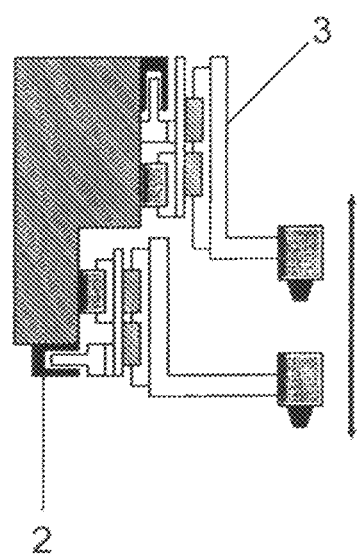
FIG. 5 shows an end view illustrating the two PNP units as shown in FIG. 1.

Now referring to FIG. 5, there is provided an end view illustrating the two PNP units as shown in FIG. 1.

Figure 6:
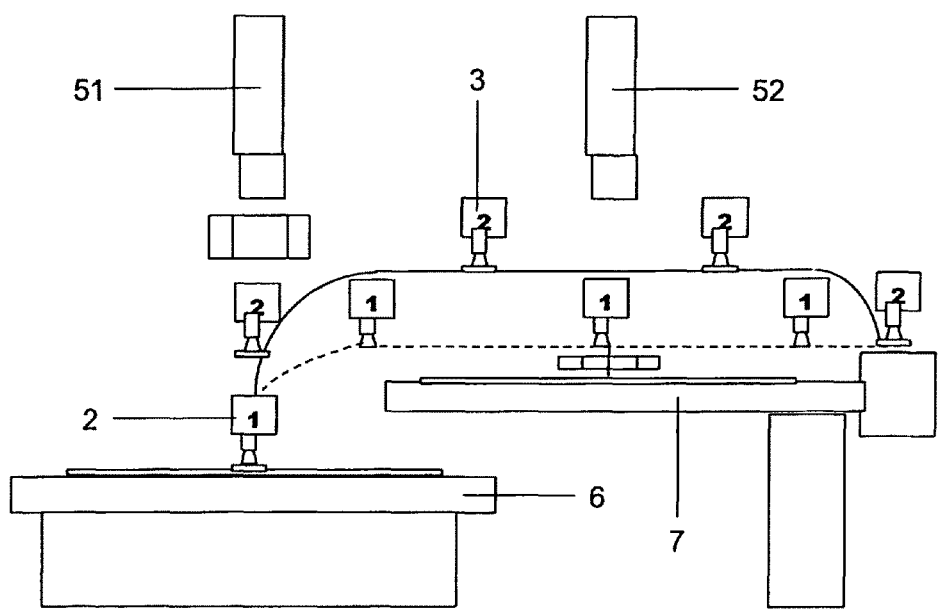
FIG. 6 shows a dynamic diagram of the movements of the two PNP units shown in FIG. 1.

Now referring to FIG. 6, there is provided a dynamic diagram of the movements of the two PNP units shown in FIG. 1.

Figure 7:
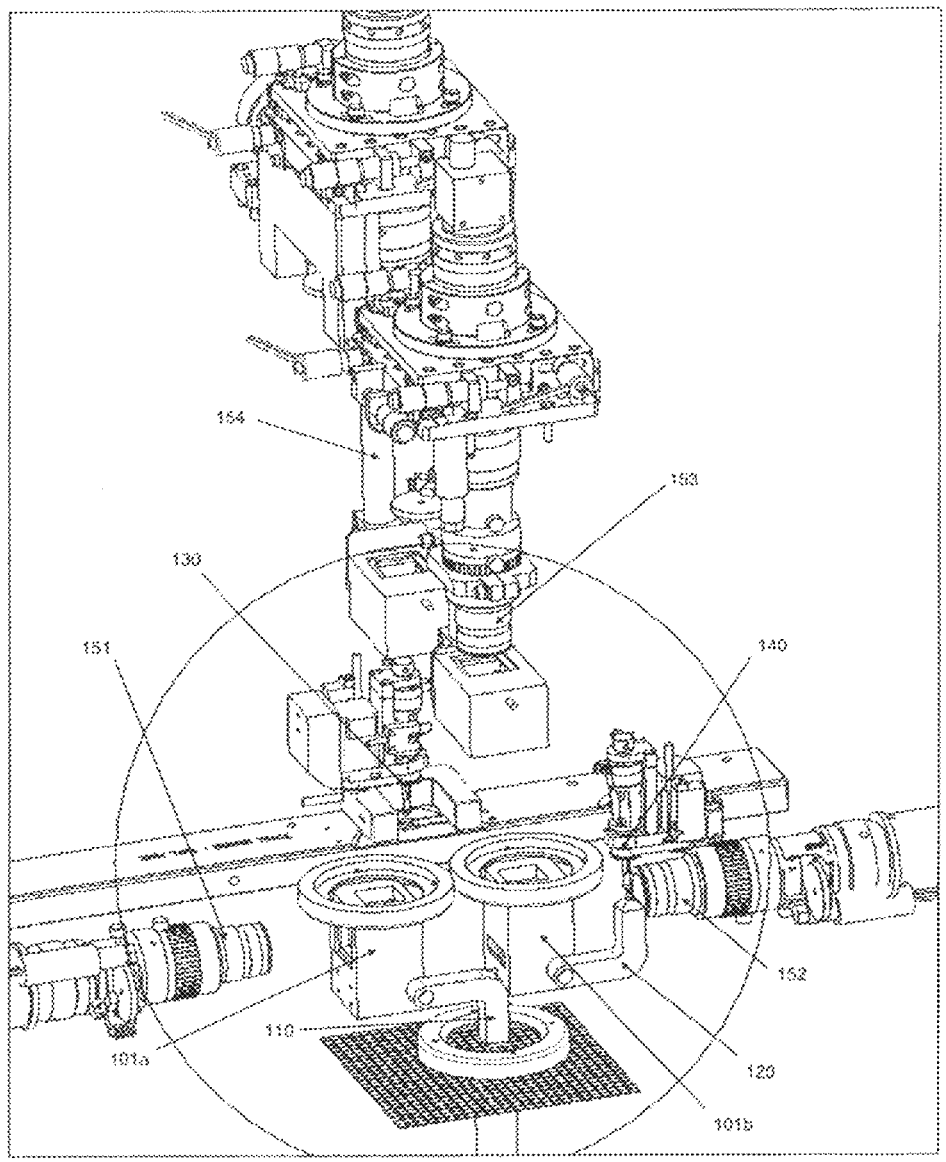
FIG. 7 shows a partial isometric view of the apparatus for processing a plurality of chips in accordance with one embodiment of the present invention.

Now referring to FIG. 7, there is provided a partial isometric view of the apparatus for processing a plurality of chips in accordance with one embodiment of the present invention. As discussed above, the chips may need to be flipped and transported so that there is a need to integrate these two mechanisms into one machine. As discussed in detailed hereinafter, the flipping mechanism has two flippers with a specific configuration. Thus, it is to be appreciated that the integration of the flipping mechanism with the transport system can be done according their parameters.

As shown in FIG. 7, the apparatus 100 comprises a flipping mechanism having a first flipper unit 110 and a second flipper unit 120, a first Pick & Place (PNP) unit 130 and a second PNP unit 140, and an inspection system having two bottom inspect cameras 151, 152, an input camera 153, and an output camera 154.

The flipping mechanism as shown in FIG. 7 comprises means for driving the flippers and controlling means (both means are not shown). The first flipper unit 110 has a right angled beam with two ends, one end being attached with one picking head for picking up the chip from a picking location, and the other end being connected to a driving means for driving the right angled beam into a pivot rotating motion from the picking location to a flipping location. The second flipper unit 120 has the similar configuration to that of the first flipper unit 110. The two flipper units 110, 120 have a mirror configuration so that while one flipper unit is picking up the chip from the picking location, the other flipper unit will be flipping the chip to the flipping location; in this way, two flipper units operate sequentially. In addition, each of the flipper units may flip the chip onto a different flipping location so that the flipped chip can be picked and placed by different Pick & Place units described in detail hereinafter.

Figure 8:
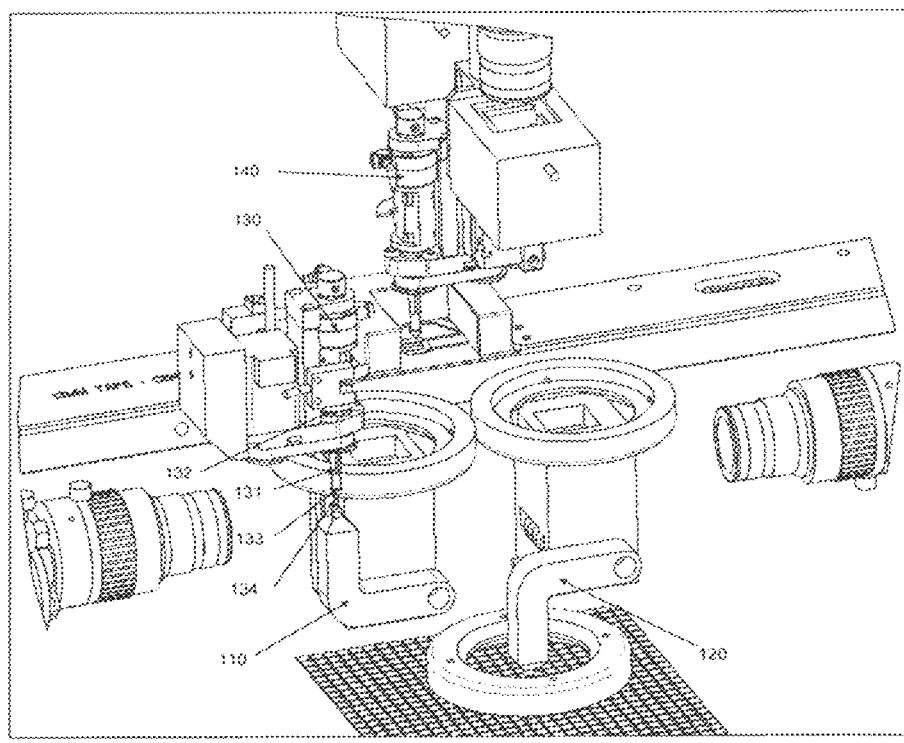
FIGS. 8 and 9 show exploded views of the motion of the first PNP unit 130 and second PNP unit 140.

The first PNP unit 130 as shown in FIG. 8 in detail comprises a maneuverable beam 131 with two ends 132, 133, and a picking head 134, where the picking head is attached to the end 133 and the end 132 is attached to the transport system 160 discussed in detail hereinafter. The second PNP unit 140 has the similar configuration to that of the first PNP unit 130. The two PNP units 130, 140 have a mirror configuration so that they can operate independently and sequentially.

Figure 9:
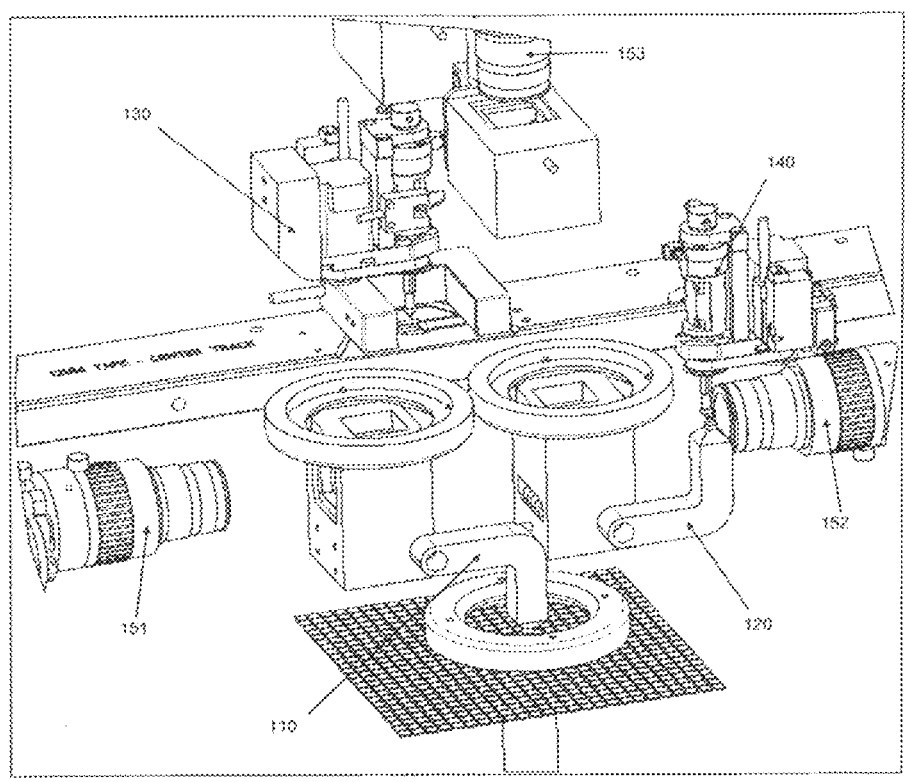

Now referring to FIGS. 8 and 9, there are provided exploded views of the motion of the first PNP unit 130 and second PNP unit 140. As shown in FIG. 8, the first flipper unit 110 has put one chip at the flipping location so that the first PNP unit 130 will pick up the flipped chip and transport the flipped chip along the pathway (1-3) to place the flipped chip onto an output means; at the meantime, the second PNP unit 140, after placing the chip onto the output means, will move to the flipping location of the second flipper unit 120 that will pick up a chip from the picking location. As shown in FIG. 9, the first flipper unit 110 is picking up a chip from the picking location, and the first PNP unit 130 is placing the flipped chip onto the output means, while the second flipper unit 120 is flipping the chip to the flipping location, and the second PNP unit 140 is picking up the flipped chip from the picking location.

Figure 10:
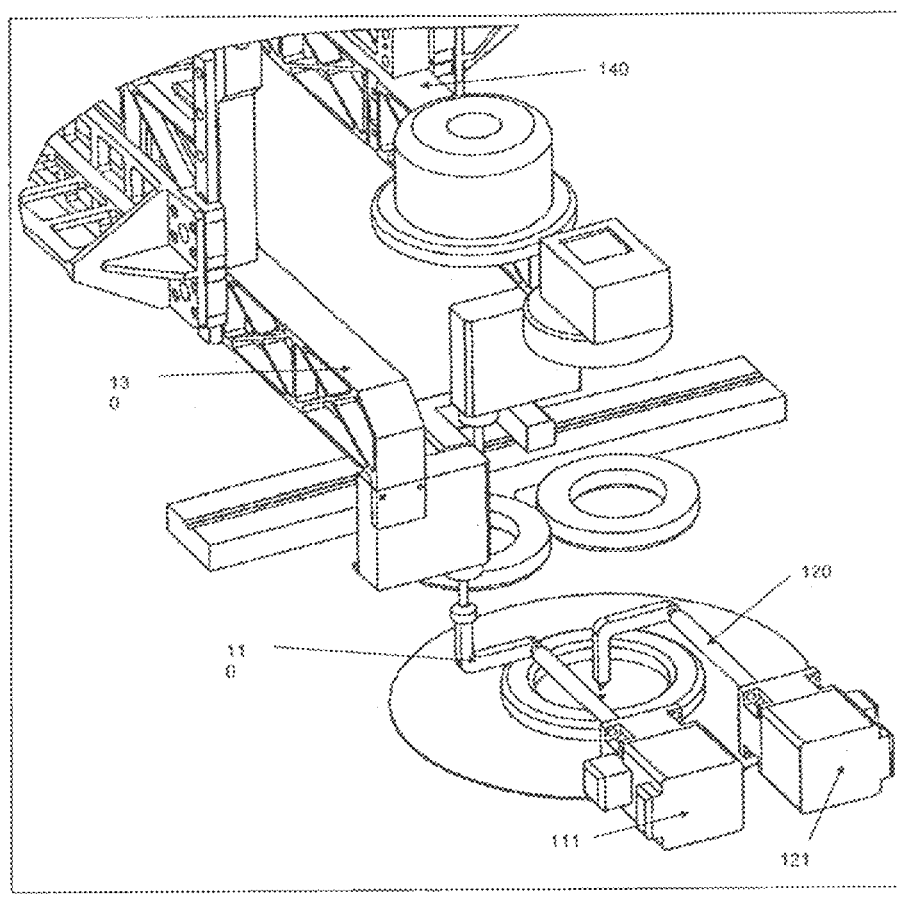
FIG. 10 is an exploded view of the flipper units in accordance with one embodiment of the present invention.

Now referring to FIG. 10, there is provided an exploded view of the flipper units in accordance with one embodiment of the present invention. The first flipper unit 110 is operated by the first driving means 111 and the second flipper unit 120 by the second driving means 121. The driving means can be any motor that can cause the flipper units into a rotational motion.

Figure 11:
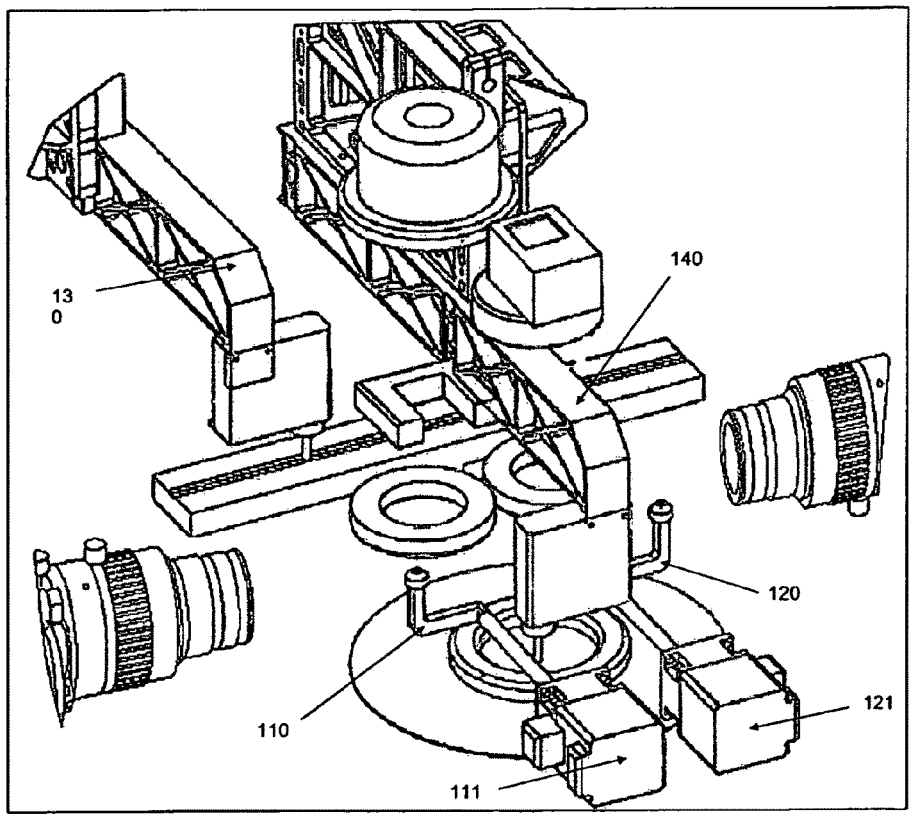
FIG. 11 is an exploded view of the flipper units in accordance with one embodiment of the present invention.

Now referring to FIG. 11, there is provided an exploded view of the flipper units in accordance with one embodiment of the present invention. The configuration of the two flipper units is the same of the one shown in FIG. 10. However, the PNP units 130, 140 may pick up the chips from the picking location directly; it means that in this configuration, the apparatus can be used to pick and place chips with or without flipping.

Figure 12:
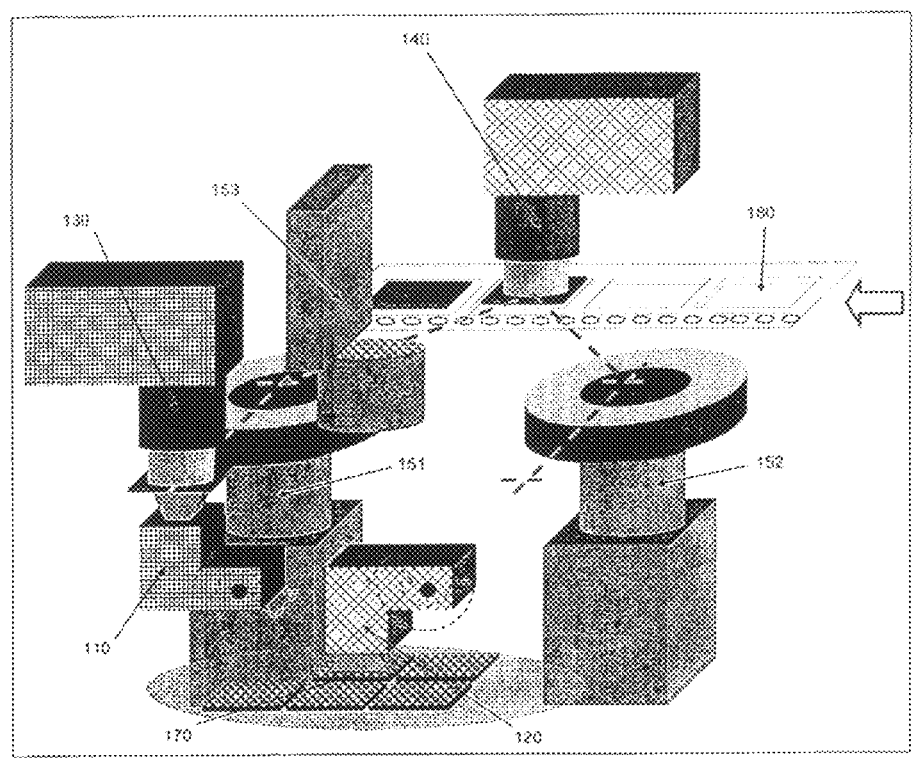
FIG. 12 shows a diagrammatic view illustrating the coordinated operations of the apparatus as shown in FIG. 7.

Now referring to FIG. 12, there is provided a diagrammatic view illustrating the coordinated operations of the apparatus as shown in FIG. 7.

Figure 13:
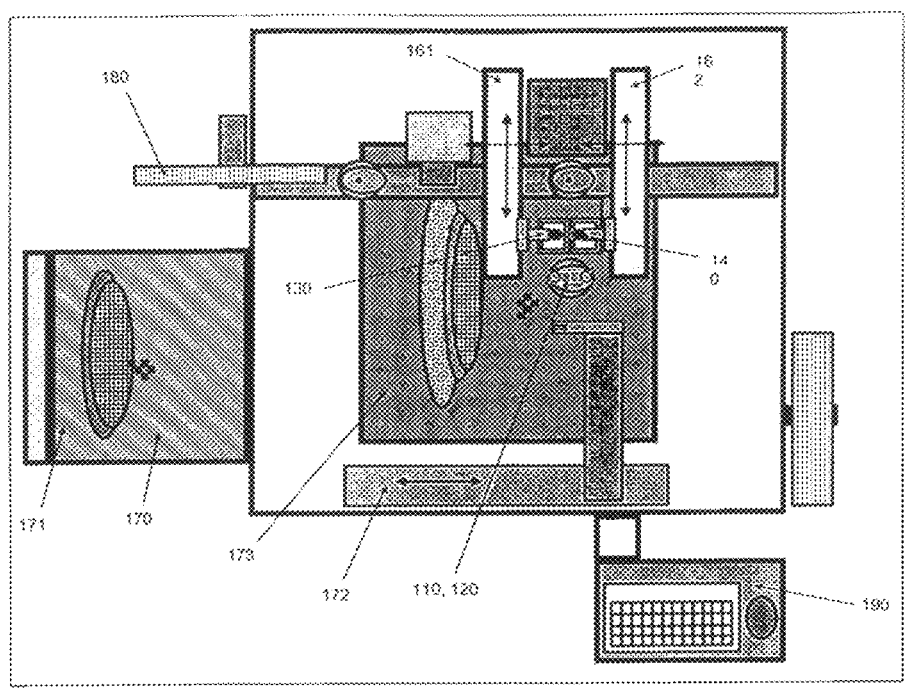
FIG. 13 shows a functional block view of the processing apparatus in accordance with one embodiment of the present invention.

Now referring to FIG. 13, there is provided a functional block view of the processing apparatus in accordance with one embodiment of the present invention. The components including the flipper units 110, 120, the PNP units 130, 140 and the inspection system 150 have been described in detail above in terms of their configurations and operations, thus the following description will be focused on the input and output means and the transporting means 160.

The chip to be processed may have different dimensions and configurations for specific applications. The input unit 170 and output unit 180 may be any available devices that are suitable for handling any chips as required by each specific application. In one embodiment of the present invention as shown in FIG. 13, a singulated wafer is the supply of the chips to be processed. The input unit 170 comprises a wafer cassette 171, a wafer feeder 172 and a wafer table 173. The wafer cassette 171 has a hollow chamber for housing a stack of singulated wafers, an upper opening for ejecting and loading the wafer to the wafer feeder 172 one at a time, and a built-in elevator for lifting the stack of wafers towards the upper opening. The wafer feeder 172 receives the wafer 171 from the upper opening of the wafer cassette 171 and conveys the wafer 171 to the wafer table 173. The wafer table 173 can be moved along the X, Y, and Z axes, and rotated about the Z axis. The X-Y movement of the wafer table 173 on a common horizontal plane allows consecutively aligning the chip to be processed with a pre-determined picking location 175. In addition, the rotary movement of the wafer table 173 about the Z axis allows adjusting the orientation of the chip in the picking location.

The output unit 180 receives the processed chip from the PNP units 130, 140, and unloads the chip. In one embodiment of the output unit as shown in FIG. 13, the output unit 180 comprises an input tape reel 181, an output tape real 182, a reel cassette 183 and a tape seal station 184. The empty tape is wound around the input tape reel 181 that is operable to rotate about a shaft. A stepper motor driven linear motion dragger connects to the free end of the empty tape and loads the tape into the reel cassette 183.

The transport means 160 comprises a first gantry unit 161 and a second gantry unit 162, where the first PNP unit 130 and second PNP unit 140 are operably disposed onto the first gantry unit 161 and second gantry unit 162 respectively. The two gantries 161, 162 are configured in parallel so that the two PNP units 130, 140 can move independently; in this way, the two PNP units can increase the output of the processing apparatus. The configuration and operation of the gantry are well known in the art.

The controlling means 190 may be any electronic microprocessor such as PC, notebook, PDA or the like. The controlling means 190 receives the instructions from a user and information from the inspection system, and send instructions to relevant components of the apparatus.

Figure 14:
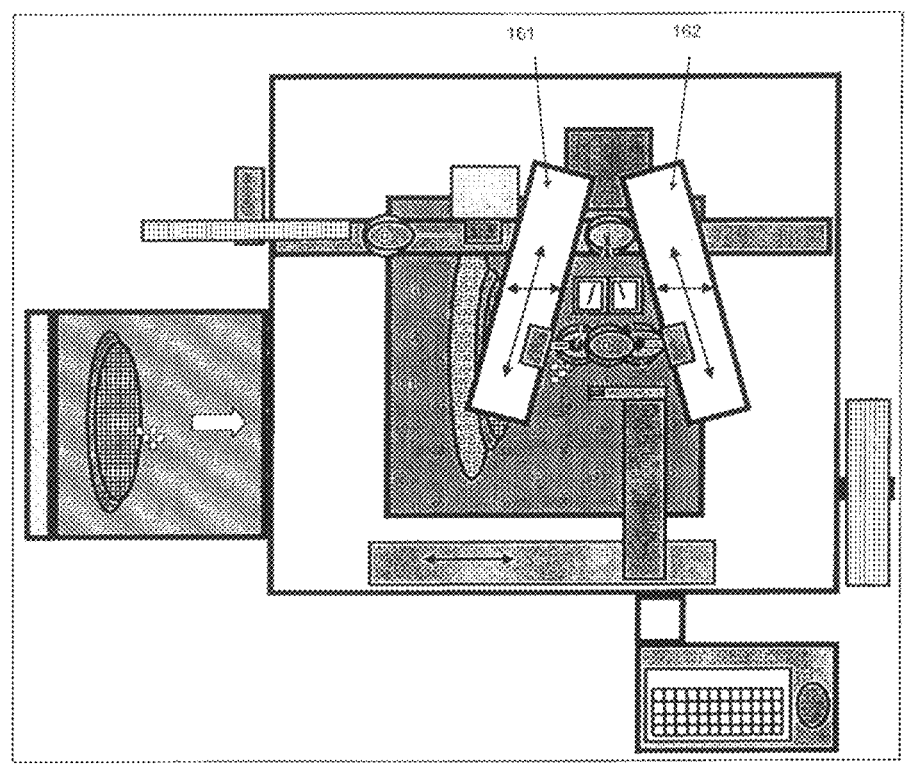
FIG. 14 shows a functional block view of the processing apparatus in accordance with one embodiment of the present invention.

Now referring to FIG. 14, there is provided a functional block view of the processing apparatus in accordance with one embodiment of the present invention. The apparatus shown in FIG. 14 is identical to the one shown in FIG. 13 except for the configuration of the two gantries 161, 162. The two gantries 161, 162 shown in FIG. 13 has a mirror configuration.

While the present invention has been described with reference to particular embodiments, it will be understood that the embodiments are illustrative and that the invention scope is not so limited. Alternative embodiments of the present invention will become apparent to those having ordinary skill in the art to which the present invention pertains. Such alternate embodiments are considered to be encompassed within the spirit and scope of the present invention. Accordingly, the scope of the present invention is described by the appended claims and is supported by the foregoing description.

What is claimed is:

1. An apparatus for object processing, comprising:
    an input unit for loading a plurality of objects, wherein at least one of plurality of objects is positioned in a first predetermined location;
    a first Pick & Place (PNP) unit and a second Pick & Place (PNP) unit for picking the positioned object from the first predetermined location and placing the picked object onto a second predetermined location; wherein the first PNP unit and second PNP unit are so configured that they can pick the positioned objects from the first predetermined location sequentially and in turn transport the picked objects to the second predetermined location;
    a transporting system for transporting the first PNP unit and second PNP unit from the first predetermined location to the second predetermined location and back forth;
    wherein the transporting system comprises a first gantry being disposed with the firs PNP unit and a second gantry being disposed with the second PNP unit, wherein the first gantry and second gantry are disposed on separate bases to form a mirror configuration so that the first PNP unit and second PNP unit travel along the first gantry and second gantry independently, and stop at the first predetermined location and second predetermined location sequentially; whereby the plurality of objects can be picked at the first predetermined location by the first PNP unit and second PNP unit, transported along the first gantry and second gantry, and placed at the second predetermined location by the first PNP unit and second PNP unit sequentially; and
    an output unit providing the second predetermined location so that the picked objects can be sequentially placed onto the output unit;
    whereby the output unit unloads the placed objects.

2. The apparatus of claim 1, wherein the plurality of objects are semiconductor dies.

3. The apparatus of claim 2, wherein the semiconductor dies loaded by the input unit and unloaded by the output unit are in a singulated wafer form or a strip form or a magazine form.

4. The apparatus of claim 1, wherein each of the first PNP unit and second PNP unit comprises a PNP head for picking, transporting and placing one of the plurality of objects, and a maneuverable arm having a first end coupled to the respective gantry, a second end coupled to the PNP head, and a body between the first end and second end, wherein the maneuverable arm is operable according to a user's instructions.

5. The apparatus of claim 4, wherein each of the first PNP unit and second PNP unit further comprises a linear motor for driving the extension or retraction of the maneuverable arm.

6. The apparatus of claim 1, wherein each of the first gantry and second gantry comprises a rail on which the PNP units are operably disposed, and a driving module for moving the operably disposed PNP along the rails.

7. An apparatus for object processing, comprising:
    an input unit for loading a plurality of objects, wherein at least one of plurality of objects is positioned in a first predetermined location;
    a first Pick & Place (PNP) unit and a second Pick & Place (PNP) unit for picking the positioned object from the first predetermined location and placing the picked object onto a second predetermined location; wherein the first PNP unit and second PNP unit are so configured that they can pick the positioned objects from the first predetermined location sequentially and in turn transport the picked objects to the second predetermined location;
    a transporting system for transporting the first PNP unit and second PNP unit from the first predetermined location to the second predetermined location and back forth; wherein the transporting system comprises a first gantry being disposed with the firs PNP unit and a second gantry being disposed with the second PNP unit, wherein the first gantry and second gantry are disposed on the same base with one gantry is above another one to form a tier configuration so that the first PNP unit and second PNP unit travel along the first gantry and second gantry independently without collision, and stop at the first predetermined location and second predetermined location sequentially; whereby the plurality of objects can be picked at the first predetermined location by the first PNP unit and second PNP unit, transported along the first gantry and second gantry, and placed at the second predetermined location by the first PNP unit and second PNP unit sequentially; and
    an output Unit providing the second predetermined location so that the picked objects can be sequentially placed onto the output unit;
    whereby the output unit unloads the placed objects.

8. The apparatus of claim 7, wherein each of the first PNP unit and second PNP unit comprises a PNP head for picking, transporting placing one of the plurality of objects, and a maneuverable arm having a first end coupled to the respective gantry, a second end coupled to the PNP head, and a body between the first end and second end, wherein the maneuverable arm is operable according to a user's instructions.

9. The apparatus of claim 8, wherein each of the first PNP unit and second PNP unit further comprises a linear motor for driving the extension or retraction of the maneuverable arm.

10. The apparatus of claim 7, wherein each of the first gantry and second gantry comprises a rail on which the PNP units are operably disposed, and a driving module for moving the operably disposed PNP along the rails.

11. The apparatus of claim 8 wherein each of the first PNP unit and second unit further comprises a Z-axis linear motor for driving the PNP unit to move along Z-axis.

12. The apparatus of claim 1, further comprising a vision inspection system for capturing and/or processing the image of the object during object processing, and a control system for receiving information from the vision inspection system and sending instructions to other components of the apparatus for precise picking and placing the object.

13. The apparatus of claim 12, wherein the vision inspection system comprises:
an input inspection camera for capturing the image of the object on the input unit in the first predetermined location and optionally processing the captured image;
at least one bottom inspection camera for capturing the image of the object picked by each of the first PNP unit and second PNP unit, wherein the at least one bottom inspection camera is disposed between the first predetermined location and second predetermined location, and optionally processing the captured image; and
an output inspection camera for capturing the image of the object placed by the PNP units on the Output unit in the second predetermined location.

14. The apparatus of claim 13, wherein each inspection camera of the vision inspection system comprises an image unit for capturing images of the object, and an optional vision microprocessor for processing the captured image.

15. An apparatus for object processing, comprising:
an input unit for loading a plurality of objects, wherein at least one of plurality of objects is positioned in a first predetermined location;
a flipping mechanism for picking up the positioned object at the first predetermined location, flipping the picked object, and positioning the flipped object in a second predetermined location, whereby the opposite side of the flipped object is available for further processing; wherein the flipping mechanism comprises a first flipping unit and a second flipping unit; wherein each of the first flipping unit and second flipping unit comprises a flipper and a driving means for driving the flipper; wherein the flipper comprises at least one flipper head that is able to pick up the positioned object at the first predetermined location and flipping the object to the second predetermined location;
a Pick & Place (PNP) mechanism for picking up the flipped object at the second predetermined location, transporting the picked flipped object to a third predetermined location, and placing the picked flipped object at the third predetermined location;
a transporting system for transporting the PNP mechanism from the second predetermined location to the third predetermined location and back forth; and
an output unit providing the third predetermined location so that the picked flipped object can be placed onto the output unit.

16. The apparatus of claim 15, wherein the plurality of objects are semiconductor dies.

17. The apparatus of claim 16, wherein the semiconductor dies loaded by the input unit and unloaded by the output unit are in a singulated wafer form or a strip form or a magazine form.

18. The apparatus of claim 15, wherein the first flipping unit and second flipping unit have a configuration that the two units are independently controlled so that they can pick up the positioned object at the first predetermined location.

19. The apparatus of claim 18, wherein the first flipping unit and second flipping unit have a mirror configuration so that each unit picks up the positioned object at the first predetermined location and flipping the picked object to the second predetermined location.

20. The apparatus of claim 19, wherein the second predetermined location for the flipped object from the first flipping unit and second flipping unit is different so that the PNP mechanism has to be able to pick the flipped object at two second predetermined locations.

21. The apparatus of claim 15, wherein the PNP mechanism comprises a first Pick & Place (PNP) unit and a second Pick & Place (PNP) unit for picking the positioned flipped object from the second predetermined location; wherein the first PNP unit and second PNP unit are so configured that they can pick the positioned flipped objects sequentially and in turn transport the picked objects to the third predetermined location.

22. The apparatus of claim 21, wherein the transporting system comprises a first gantry being disposed with the firs PNP unit and a second gantry being disposed with the second PNP unit, wherein the first gantry and second gantry are positioned on the same horizontal plane and have a mirror configuration so that the first PNP unit and second PNP unit travel along the first gantry and second gantry separately, and stop at the second predetermined location and third predetermined location sequentially;
whereby the plurality of objects can be picked at the second predetermined location by the first PNP unit and second PNP unit, transported along the first gantry and second gantry, and placed at the third predetermined location by the first PNP unit and second PNP unit sequentially.

23. The apparatus of claim 22, wherein each of the first PNP unit and second PNP unit comprises a PNP head for picking, transporting placing one of the plurality of objects, and a maneuverable arm having a first end coupled to the respective gantry, a second end coupled to the PNP head, and a body between the first end and second end, wherein the maneuverable arm is operable according to a user's instructions.

24. The apparatus of claim 23, wherein each of the first PNP unit and second PNP unit further comprises a linear motor for driving the extension or retraction of the maneuverable arm.

25. The apparatus of claim 22, wherein each of the first gantry and second gantry comprises a rail on which the PNP units are operably disposed, and a driving module for moving the operably disposed PNP along the rails.

26. The apparatus of claim 21, wherein the transporting system comprises a first gantry being disposed with the firs PNP unit and a second gantry being disposed with the second PNP unit, wherein the first gantry and second gantry are positioned on two horizontal planes and have a tier configuration so that the first PNP unit and second PNP unit travel along the first gantry and second gantry separately, and stop at the second predetermined location and third predetermined location sequentially;
whereby the plurality of objects can be picked at the second predetermined location by the first PNP unit and second PNP unit, transported along the first gantry and second gantry, and placed at the third predetermined location by the first PNP unit and second PNP unit sequentially.

27. The apparatus of claim 26, wherein each of the first PNP unit and second PNP unit comprises a PNP head for picking, transporting placing one of the plurality of objects, and a maneuverable arm having a first end coupled to the respective gantry, a second end coupled to the PNP head, and a body between the first end and second end, wherein the maneuverable arm is operable according to a user's instructions.

28. The apparatus of claim 27, wherein each of the first PNP unit and second PNP unit further comprises a linear motor for driving the extension or retraction of the maneuverable arm.

29. The apparatus of claim 26, wherein each of the first gantry and second gantry comprises a rail on which the PNP units are operably disposed, and a driving module for moving the operably disposed PNP along the rails.

30. The apparatus of claim 23 or 27, wherein each of the first PNP unit and second unit further comprises a Z-axis linear motor for driving the PNP unit to move along Z-axis.

31. The apparatus of claim 15, further comprising a vision inspection system for capturing and/or processing the image of the object during object processing, and a control system for receiving information from the vision inspection system and sending instructions to other components of the apparatus for precise picking and placing the object.

32. An apparatus for object processing, comprising:
   an input unit for loading a plurality of objects, wherein at least one of plurality of objects is positioned in a first predetermined location;
   a flipping mechanism for picking up the positioned object at the first predetermined location, flipping the picked object, and positioning the flipped object in a second predetermined location, whereby the opposite side of the flipped object is available for further processing;
   wherein the flipping mechanism comprises one flipper and a driving means for driving the flipper, and wherein the flipper comprises a flipper arm having two free ends and operable to rotate about a pivot, two flipper heads attached to the two ends of the flipper arm for sequentially acquiring the object from the input unit at the first predetermined location and positioning the flipped object in the second predetermined location;
   a Pick & Place (PNP) mechanism for picking tip the flipped object at the second predetermined location, transporting the picked flipped object to a third predetermined location, and placing the picked flipped object at the third predetermined location;
   a transporting system for transporting the PNP mechanism from the second predetermined location to the third predetermined location and back forth; and
   an output unit providing the third predetermined location so that the picked flipped object can be placed onto the output unit;
   wherein the flipping mechanism comprises one flipper and a driving means for driving the flipper, and wherein the flipper comprises a flipper arm having two free ends and operable to rotate about a pivot, two flipper heads attached to the two ends of the flipper arm for sequentially acquiring the object from the input unit at the first predetermined location and positioning the flipped object in the second predetermined location.

* * * * *